(12) United States Patent
Park et al.

(10) Patent No.: US 7,414,691 B2
(45) Date of Patent: Aug. 19, 2008

(54) LIQUID CRYSTAL DISPLAY DEVICE WITH PREVENTION OF DEFECTIVE DISCONNECTION OF DRAIN/PIXEL ELECTRODES BY FORMING TWO CONDUCTIVE LAYERS ON TOP OF ENTIRE PIXEL ELECTRODE AND THEN REMOVING A PORTION OF BOTH THEREFROM

(75) Inventors: Yong In Park, Gyeonggi-Do (KR); Juhn Suk Yoo, Seoul (KR)

(73) Assignee: LG Display Co., Ltd., Seoul (KR)

( * ) Notice: Subject to any disclaimer, the term of this patent is extended or adjusted under 35 U.S.C. 154(b) by 334 days.

(21) Appl. No.: 11/153,480

(22) Filed: Jun. 16, 2005

(65) Prior Publication Data

US 2006/0033854 A1     Feb. 16, 2006

(30) Foreign Application Priority Data

Aug. 12, 2004   (KR) ................. 10-2004-0063590

(51) Int. Cl.
*G02F 1/1343* (2006.01)
(52) U.S. Cl. ..................... 349/147; 349/187
(58) Field of Classification Search ............ 349/147, 349/148, 114
See application file for complete search history.

(56) References Cited

U.S. PATENT DOCUMENTS

| | | | | |
|---|---|---|---|---|
| 5,771,083 A | * | 6/1998 | Fujihara et al. | 349/147 |
| 5,828,433 A | * | 10/1998 | Shin | 349/147 |
| 6,403,409 B1 | | 6/2002 | You | |
| 6,451,630 B2 | | 9/2002 | Lee | |
| 6,617,203 B2 | | 9/2003 | Kim et al. | |
| 6,753,235 B2 | | 6/2004 | So et al. | |
| 7,068,335 B2 | * | 6/2006 | Jang et al. | 349/114 |

2003/0151049 A1   8/2003   Hotta et al.

FOREIGN PATENT DOCUMENTS

| | | |
|---|---|---|
| KR | 1019970003717 B1 | 3/1997 |
| KR | 1019970008589 B1 | 5/1997 |
| KR | 1019970011966 B1 | 8/1997 |
| KR | 100161461 B1 | 8/1998 |
| KR | 0175408 | 2/1999 |
| KR | 0177785 | 3/1999 |
| KR | 0184509 | 4/1999 |
| KR | 10-0192593 | 7/1999 |

(Continued)

*Primary Examiner*—David C. Nelms
*Assistant Examiner*—John Heyman
(74) *Attorney, Agent, or Firm*—McKenna, Long & Aldridge LLP

(57) ABSTRACT

A method for fabricating an LCD device includes providing first and second substrates and has a contact hole exposing a portion of the source and drain regions formed by removing a portion of the first and second insulation layers and removing the second insulation layer of the upper portion of the pixel electrode. The method also includes forming a third conductive layer on the first substrate; forming source and drain electrodes electrically connected to the source and drain regions through the contact hole by patterning the third conductive layer and exposing the second conductive layer of the upper portion of the pixel electrode; and forming a liquid crystal layer between the first and second substrates.

22 Claims, 14 Drawing Sheets

FOREIGN PATENT DOCUMENTS

| | | |
|---|---|---|
| KR | 1020000025565 A | 5/2000 |
| KR | 1020000026894 A | 5/2000 |
| KR | 1020000026895 A | 5/2000 |
| KR | 1020000031451 A | 6/2000 |
| KR | 1020000041223 A | 7/2000 |
| KR | 1020000075031 A | 12/2000 |
| KR | 1020010019665 A | 3/2001 |
| KR | 1020010019668 A | 3/2001 |
| KR | 100297706 B1 | 5/2001 |
| KR | 1020010054739 A | 7/2001 |
| KR | 1020010055071 A | 7/2001 |
| KR | 1020010056037 A | 7/2001 |
| KR | 1020010110917 A | 12/2001 |
| KR | 1020020009188 A | 2/2002 |
| KR | 1020020022258 A | 3/2002 |
| KR | 1020020071061 A | 9/2002 |
| KR | 1020020071062 A | 9/2002 |
| KR | 1020020074897 A | 10/2002 |
| KR | 1020020078116 A | 10/2002 |
| KR | 1020020079196 A | 10/2002 |
| KR | 1020020080202 A | 10/2002 |
| KR | 1020030006619 A | 1/2003 |
| KR | 1020030030286 A | 4/2003 |

* cited by examiner

LIQUID CRYSTAL DISPLAY DEVICE WITH PREVENTION OF DEFECTIVE DISCONNECTION OF DRAIN/PIXEL ELECTRODES BY FORMING TWO CONDUCTIVE LAYERS ON TOP OF ENTIRE PIXEL ELECTRODE AND THEN REMOVING A PORTION OF BOTH THEREFROM

This application claims the benefit of Korean Patent Application No. 10-2004-0063590, filed on Aug. 12, 2004, which is hereby incorporated by reference for all purposes as if fully set forth herein.

BACKGROUND OF THE INVENTION

1. Field of the Invention

The present invention relates to a liquid crystal display (LCD) device and its fabrication method, and more particularly, to an LCD device and its fabrication method capable of simplifying a fabrication process and enhancing yield by reducing the number of masks used for fabrication of a polycrystalline silicon thin film transistor.

2. Description of the Related Art

Recently, as research and development of information displays and demand for using a portable (mobile) information medium increase, research on and commercialization of a light thin film type flat panel display (FPD) which can substitute for the existing display device CRT are actively ongoing.

Of the FPDs, in particular, an LCD, a device for producing an image by using the optical anisotropy of liquid crystal, exhibits excellent resolution, color display and picture quality, so it is popular in notebook computers, desktop monitors or the like.

The liquid crystal display panel includes a color filter substrate, namely, a first substrate, an array substrate, namely, a second substrate, and a liquid crystal layer formed between the color filter substrate and the array substrate.

As a switching device of the liquid crystal display device, the thin film transistor (TFT) is used, and as a channel layer of the TFT, an amorphous silicon thin film or a polycrystalline silicon thin film is used.

In a process for fabricating the LCD device, a plurality of masking processes (namely, photolithography process) are required for fabricating the array substrate including the TFT, so a method for reducing the number of masking processes is on demand in terms of productivity.

The structure of the general LCD device will now be described with reference to FIG. 1.

FIG. 1 is a plan view illustrating a portion of an array substrate of the general LCD device. Although actual array substrate includes the M×N number of pixels as the N number of gate lines and the M number of data lines cross each other, only one pixel is illustrated in FIG. 1 for the sake of explanation.

As illustrated, a gate line 16 and a data line 17 are arranged vertically and horizontally on an array substrate 10, defining a pixel region. A TFT as a switching device is formed at the crossing of the gate line 16 and the data line 17. A pixel electrode 18 is formed at each pixel region.

The TFT includes a gate electrode 21 connected to the gate line 16, a source electrode 22 connected to the data line 17 and a drain electrode 23 connected to the pixel electrode 18. The TFT also includes a first insulation film (not illustrated) and a second insulation film (not illustrated) for insulating the gate electrode 21 and source/drain electrodes 22 and 23, and an active pattern 24 for forming a conductive channel between the source electrode 22 and drain electrode 23 by a gate voltage supplied to the gate electrode 21.

Through the first contact hole 40A formed at the first and second insulation films, the source electrode 22 is electrically connected with a source region of the active pattern 24 and the drain electrode 23 is electrically connected with a drain region of the active pattern 24.

A third insulation film (not illustrated) having a second contact hole 40B is formed on the drain electrode 23, so that the drain electrode 23 and the pixel electrode 18 are electrically connected through the second contact hole 40B.

The process of fabricating the array substrate constructed as described will now be explained with reference to FIGS. 2A to 2F.

FIGS. 2A to 2F are sequential sectional views of the process for fabricating the array substrate of FIG. 1 taken along line I-I'. The illustrated TFT is a polycrystalline silicon TFT which uses polycrystalline silicon as a channel layer.

As illustrated in FIG. 2A, the active pattern 24 is formed as a polycrystalline silicon thin film on the substrate 10 by using a photolithography process (a first masking process).

Next, as illustrated in FIG. 2B, a first insulation film 15A and a conductive metal material are sequentially deposited on the entire surface of the substrate 10 with the active pattern 24 formed thereon, and then, the conductive metal material is selectively patterned by using the photolithography process (a second masking process) to form the gate electrode 21 over the active pattern 24 with the first insulation film 15A interposed therebetween.

Thereafter, p+ type or n+ type source/drain regions 24A and 24B are formed at certain regions of the active pattern 24 by injecting a high density impurity ion by using the gate electrode 21 as a mask. The source/drain regions 24A and 24B are formed for ohmic contact with source/drain electrodes (to be described).

And then, as illustrated in FIG. 2C, a second insulation film 15B is deposed on the entire surface of the substrate 10 with the gate electrode 21 formed thereon, and then, a portion of the first and second insulation films 15A and 15B is removed through the photolithography (a third masking process) to form the first contact hole 40A exposing a portion of the source/drain regions 24A and 24B.

Subsequently, as illustrated in FIG. 2D, a conductive metal material is deposited on the entire surface of the substrate 10 and then patterned by using the photolithography process (a fourth making process) to form the source electrode 22 connected with the source region 24A and the drain electrode 23 connected with the drain region 24B through the first contact hole 40A. In this case, a portion of the conductive metal layer constituting the source electrode 22 extends in one direction to form the data line 17.

And then, as illustrated in FIG. 2E, a third insulation film 15C is deposited on the entire surface of the substrate 10, and then, a second contact hole 40B is formed, exposing a portion of the drain electrode 23 by using the photolithography process (a fifth masking process).

Finally, as illustrated in FIG. 2F, a transparent conductive metal material is deposited on the entire surface of the substrate 10 with the third insulation film 15C formed thereon and then patterned by using the photolithography process (a sixth masking process) to form a pixel electrode 18 connected with the drain electrode 23 through the second contact hole 40B.

As mentioned above, in fabricating the array substrate including the polycrystalline silicon TFT, a total of six photolithography processes are required to pattern the active pattern, the gate electrode, the first contact hole, the source/ drain electrodes, the second contact hole and the pixel electrode.

The photolithography process is a process of transferring a pattern formed on a mask onto the thin film-deposited substrate to form a desired pattern, including a plurality of processes such as applying a photosensitive solution, exposing and developing process. As a result, the plurality of photolithography processes degrade a production yield and cause a high possibility that a fabricated TFT is defective.

In particular, the mask designed to form the pattern is expensive, so the increase in the number of masks applied to the process would lead to an increase in a fabrication cost proportionally.

SUMMARY OF THE INVENTION

Therefore, one advantage of the present invention is to provide an LCD device and its fabrication method capable of reducing the number of masks to be used for fabrication of a thin film transistor (TFT) by simultaneously forming a gate electrode, a gate line and a pixel electrode.

Another advantage of the present invention is to provide an LCD device and its fabrication method capable of preventing a defective disconnection of a drain electrode due to an undercut at an edge of a pixel electrode by simultaneously performing patterning of source/drain electrodes and removing of a gate metal exposing the pixel electrode.

To achieve these and other advantages and in accordance with the purpose of the present invention, as embodied and broadly described herein, there is provided a method for fabricating an LCD device including: providing first and second substrates; forming an active layer having a source region, a drain region and a channel region on the first substrate; forming a first insulation layer on the first substrate; forming first and second conductive layers on the first substrate; forming a gate electrode, a gate line and a pixel electrode by patterning the first and second conductive layers; forming a second insulation layer on the first substrate; forming a contact hole exposing a portion of the source and drain regions by removing a portion of the first and second insulation layers and removing the second insulation layer of the upper portion of the pixel electrode; forming a third conductive layer on the first substrate; forming source and drain electrodes electrically connected to the source and drain regions through the contact hole by patterning the third conductive layer and exposing the second conductive layer of the upper portion of the pixel electrode; and forming a liquid crystal layer between the first and second substrates.

To achieve the above advantages, there is also provided a method for fabricating an LCD device including: providing first and second substrates; forming an active layer on the first substrate; forming a first insulation layer on the first substrate; forming a gate electrode, a gate line and a pixel electrode formed of a dual layer having first and second conductive layers; forming a second insulation layer exposing a portion of the active layer and the pixel electrode; forming source and drain electrodes electrically connected to the portion of the active layer through the contact hole by patterning a third conductive layer and exposing the pixel electrode of the first conductive layer; and forming a liquid crystal layer between the first and second substrates.

In order to achieve the above advantages, there is also provided a liquid crystal display (LCD) device including: first and second substrates; an active layer on the first substrate; a first insulation layer on the first substrate; a gate electrode, a gate line and a pixel electrode, the gate electrode and the gate line having first and second conductive layers and the pixel electrode having the first conductive layer; a second insulation layer on the first substrate, the second insulation layer having a contact hole; a source electrode and a drain electrode on the first substrate, the source electrode being connected to a source region and the drain electrode being connected to a drain region through the contact hole; and a liquid crystal layer between the first and second substrates.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

An LCD device and its fabrication method in accordance with exemplary embodiments of the present invention will now be described with reference to the accompanying drawings.

Figure 1:
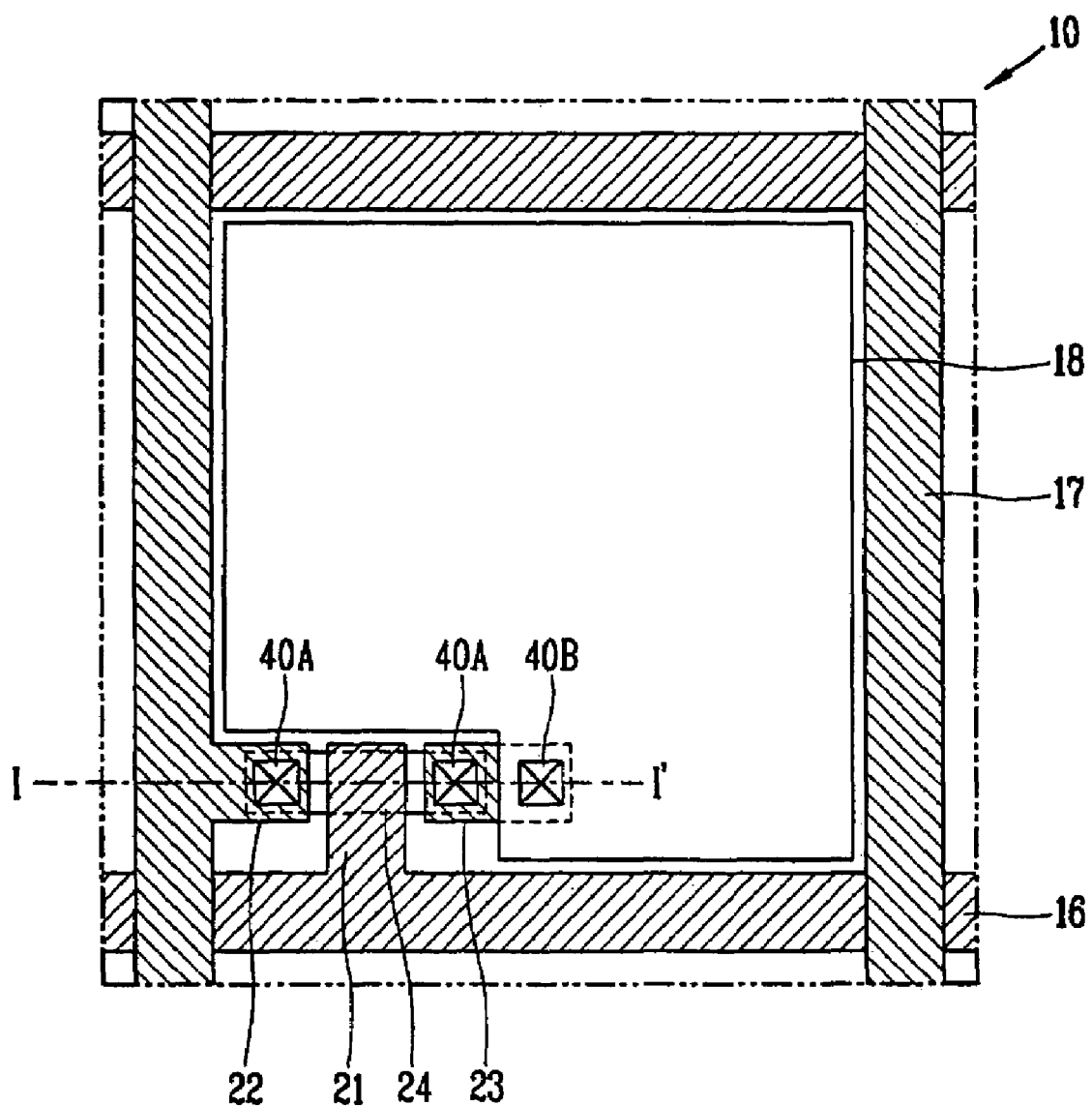
FIG. 1 is a plan view illustrating a portion of an array substrate of a general LCD device.
Figure 2A:
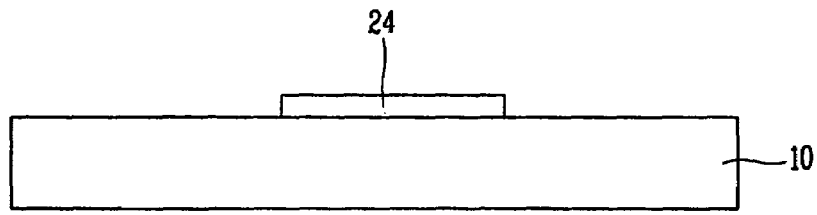
FIGS. 2A to 2F are sequential sectional view illustrating a process of fabricating the array substrate taken along line I-I' of FIG. 1.
Figure 2B:
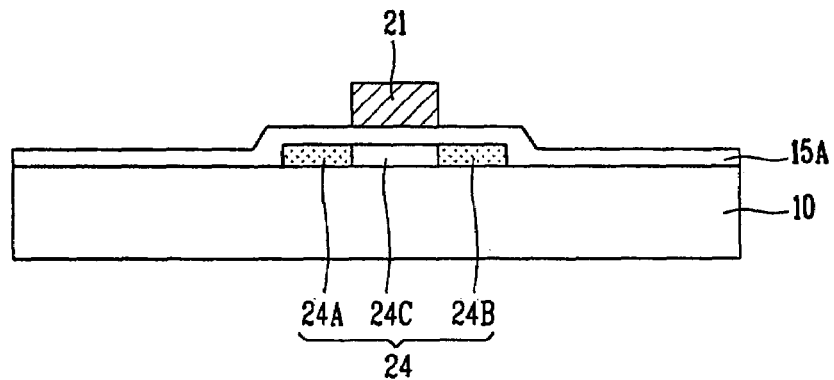
Figure 2C:
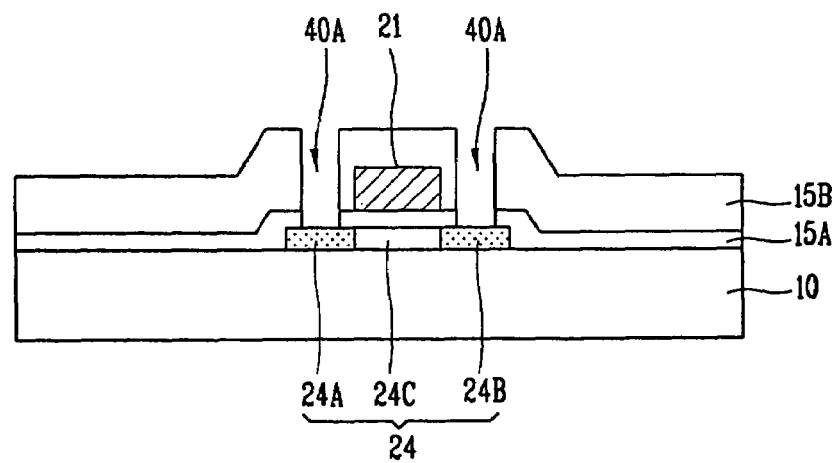
Figure 2D:
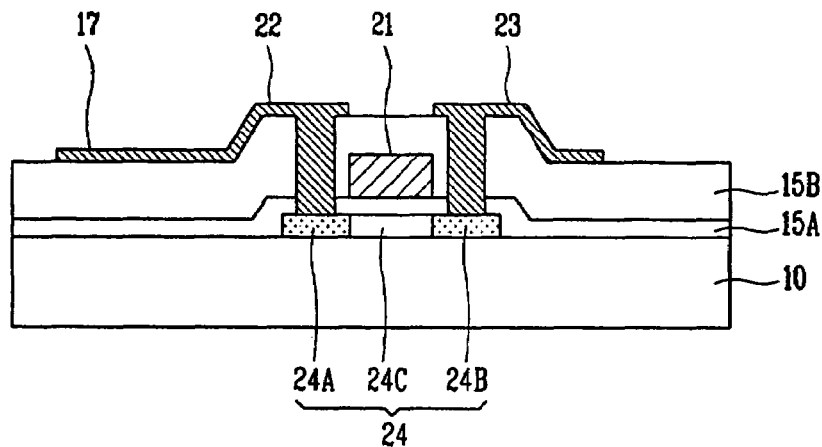
Figure 2E:
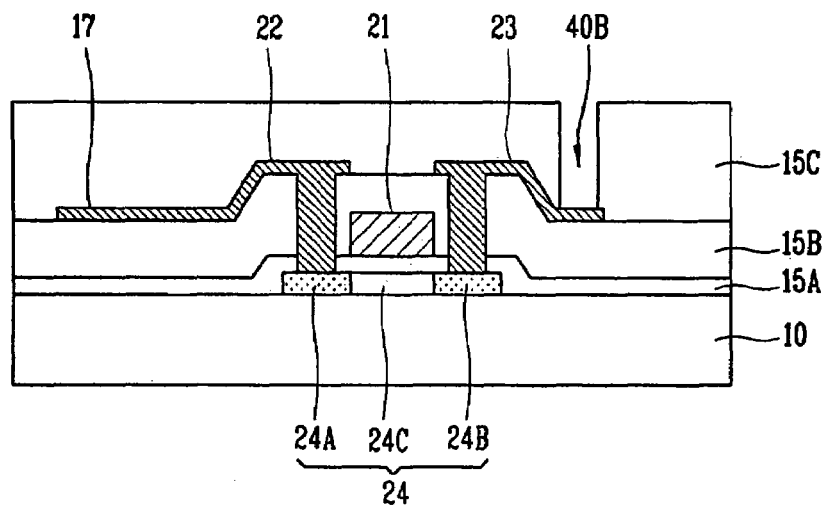
Figure 2F:
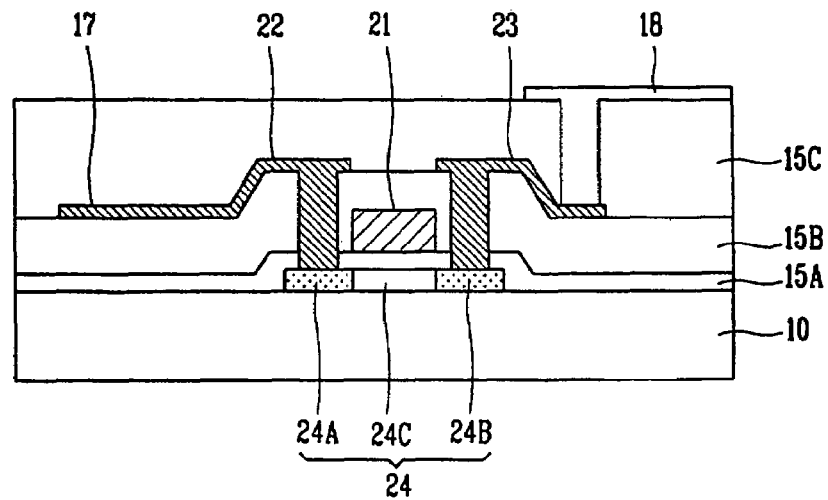
Figure 3:
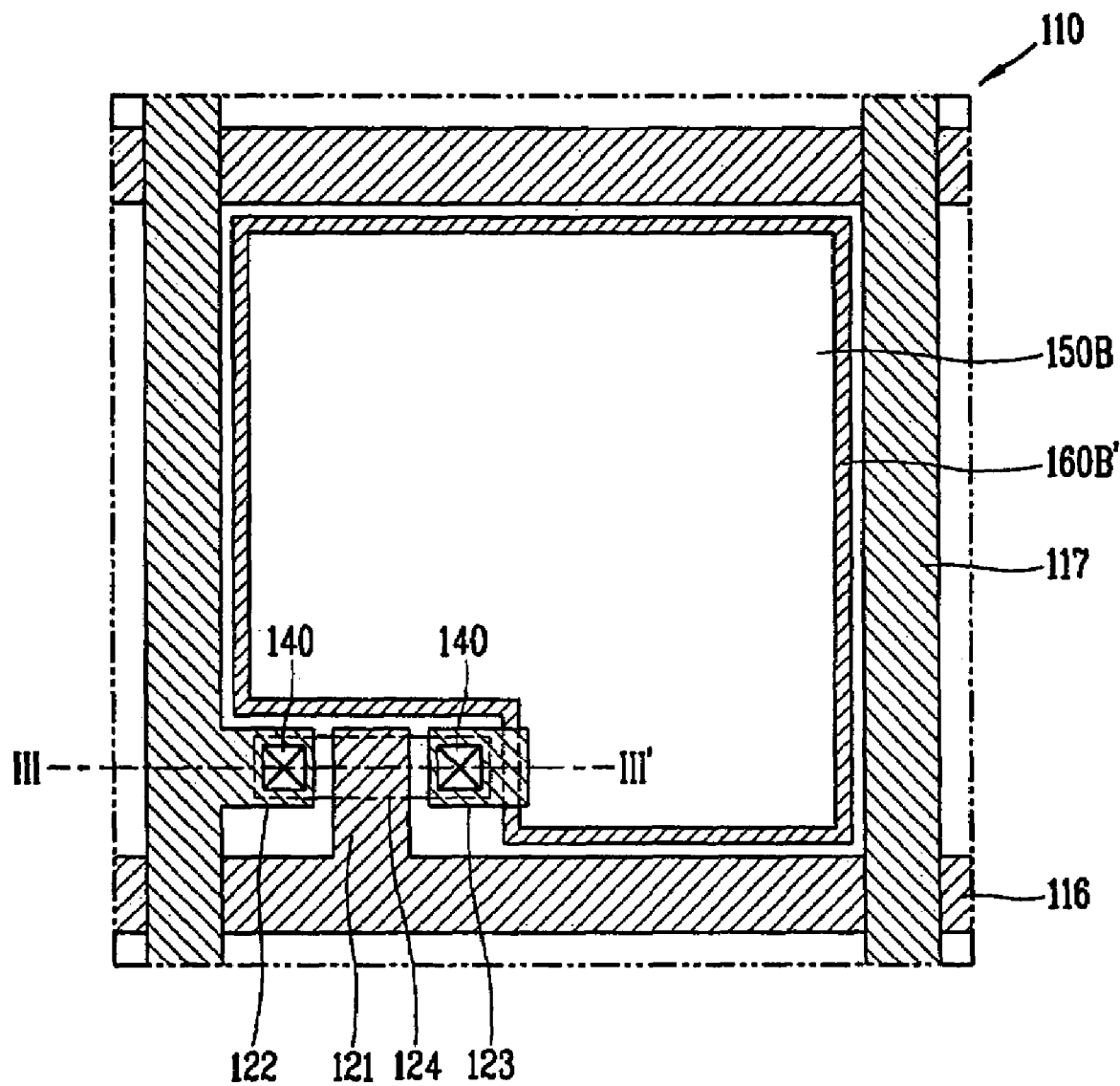
FIG. 3 is a plan view illustrating a portion of an array substrate of an LCD device in accordance with the first embodiment of the present invention.

FIG. 3 is a plan view illustrating a portion of an array substrate of an LCD device in accordance with the first embodiment of the present invention, particularly illustrating one pixel including a thin film transistor (TFT). Although actual LCD device includes the M×N number of pixels as the N number of gate lines and the M number of data lines cross each other, only one pixel is illustrated in FIG. 3 for the sake of explanation.

In this embodiment, a polycrystalline silicon TFT using a polycrystalline silicon thin film as a channel layer is taken as an example, and the present invention is not limited thereto and an amorphous silicon thin film can be used as the channel layer of the TFT.

As illustrated, a gate line 116 and a data line 117 are arranged vertically and horizontally on the array substrate 110, defining a pixel region. In addition, a TFT as a switching device is formed at the crossing of the gate line 116 and the data line 117, and a pixel electrode 150B connected with the TFT and driving liquid crystal (not illustrated) together with a common electrode of a color filter substrate (not illustrated) is formed in the pixel region.

The TFT includes a gate electrode 121 connected with the gate line 116, a source electrode 122 connected with the data line 117 and a drain electrode 123 connected with the pixel electrode 150B. In addition, the TFT also includes first and second insulation films (not illustrated) for insulating the gate electrode 121 and the source/drain electrodes 122 and 123, and an active pattern 124 for forming a conductive channel between the source electrode 122 and the drain electrode 123 by a gate voltage supplied to the gate electrode 121.

A portion of the source electrode 122 is electrically connected with a source region of the active pattern 124 and a portion of the drain electrode 123 is electrically connected with a drain region of the active pattern 124 through a contact hole 140 formed at the first and second insulation films. Another portion of the source electrode 122 is connected with the data line 117 to form a portion of the data line 117 and another portion of the drain electrode 123 extends toward the pixel region to be electrically connected with the pixel electrode 150B.

A conductive pattern 160B' formed of a gate metal (namely, a conductive material constituting the gate electrode 121 and the gate line 116) remains at an edge of the pixel electrode 150B, and by simultaneously forming the pixel electrode 150B together with the gate electrode 121 and the gate line 116 on the same layer, the number of masks used for fabricating the TFT can be reduced, which will now be described in detail through a process for fabricating the array substrate.

FIGS. 4A to 4D are sequential sectional views illustrating a process of fabricating the array substrate taken along line III-III' of FIG. 3.

Figure 4A:
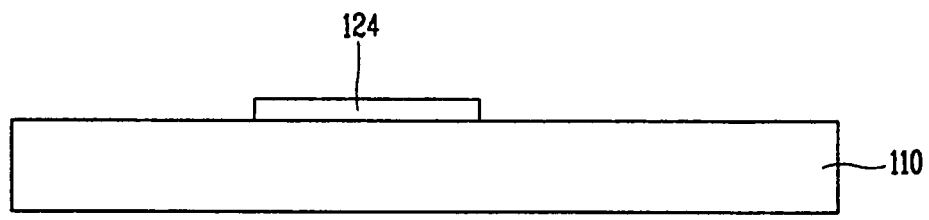
FIGS. 4A to 4D are sequential sectional views illustrating a process of fabricating the array substrate taken along line III-III' of FIG. 3.

As illustrated in FIG. 4A, the active pattern 124 is formed as a silicon layer on the substrate 110 made of a transparent insulation material such as glass by using a photolithography process (a first masking process).

In this case, a buffer layer can be formed as a silicon oxide film (SiO2) on the substrate 110, on which the active pattern 124 can be formed. The buffer layer serves to prevent infiltration of an impurity such as natrium (Na) existing in the glass substrate 110 into an upper layer during a process.

The silicon layer can be formed as an amorphous silicon thin film or a crystallized silicon thin film, and in the present invention, the TFT is formed by using the crystallized polycrystalline silicon thin film. The polycrystalline silicon thin film can be formed by using various crystallizing methods after the amorphous silicon thin film is formed on the substrate, which will be described as follows.

First, the amorphous silicon thin film can be deposited to be formed in various methods, of which a typical method is a low pressure chemical vapor deposition (LPCVD) and plasma enhanced chemical vapor deposition (PECVD).

Thereafter, in order to remove hydrogen atoms existing in the amorphous silicon thin film, dehydrogenation process is performed and then crystallization is performed thereon. In order to crystallize the amorphous silicon thin film, solid phase crystallization (SPC) in which the amorphous silicon thin film is thermally treated in a high temperature furnace or examiner laser annealing (ELA) using laser can be used.

As the laser crystallization, the ELA using laser in a pulse form is commonly used, and recently, research is ongoing on sequential lateral solidification (SLS) which remarkably improves crystallization characteristics by making grains grow laterally (in a horizontal direction).

The SLS uses the fact that grains are grown in a vertical direction to an interface of liquid phase silicon and solid phase silicon at the interface. By growing grains to a certain length laterally by suitably controlling a size of a laser energy and laser beam irradiation range, the size of silicon grains can be enhanced.

Figure 4B:
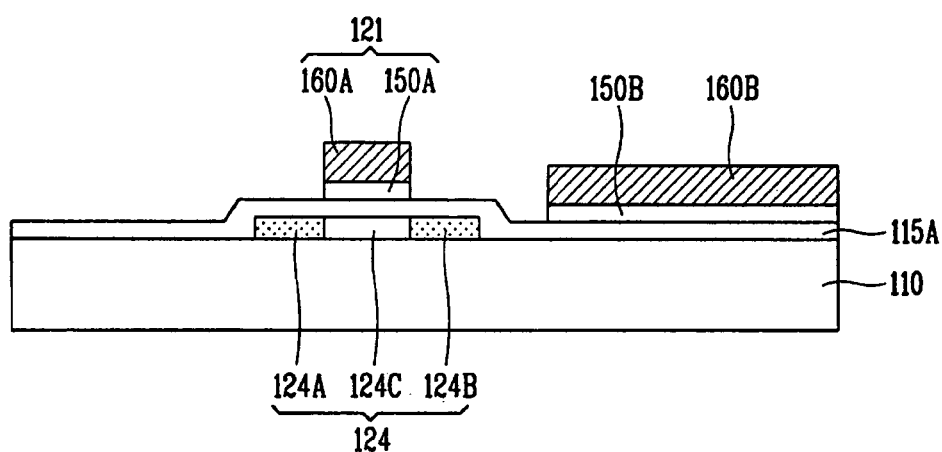
Figure 4C:
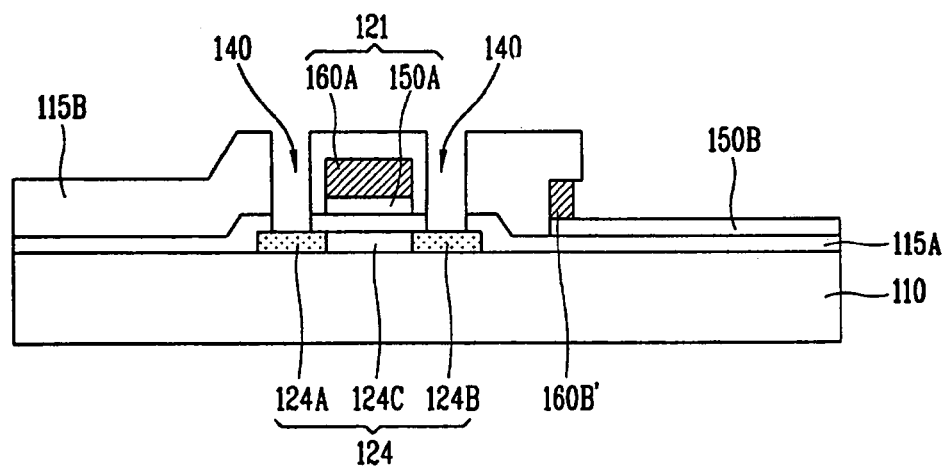

FIGS. 4B and 4C illustrate the process of simultaneously forming the gate electrode, the gate line and the pixel electrode in accordance with the first embodiment of the present invention, which will now be described with reference to FIGS. 5A and 5D.

Figure 5A:
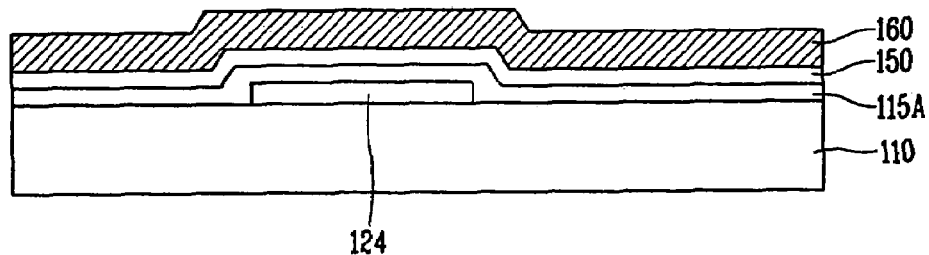
FIGS. 5A to 5D are sectional views illustrating a process of simultaneously forming a gate electrode, a gate line and a pixel electrode in FIGS. 4B and 4C in accordance with the first embodiment of the present invention.

As illustrated in FIG. 5A, a first insulation film 115A, namely, a gate insulation film, a first conductive film 150 and a second conductive film 160 are sequentially formed on the entire surface of the substrate 110 with the active pattern 124 formed thereon.

The first conductive film 150 is made of a transparent conductive material with excellent transmittance, such as indium tin oxide (ITO) or indium zinc oxide (IZO), for forming the pixel electrode, and the second conductive film 160 is formed of a low-resistance opaque conductive material such as aluminum, an aluminum alloy, tungsten, copper, chromium, molybdenum or the like for forming the gate electrode and the gate line.

Figure 5B:
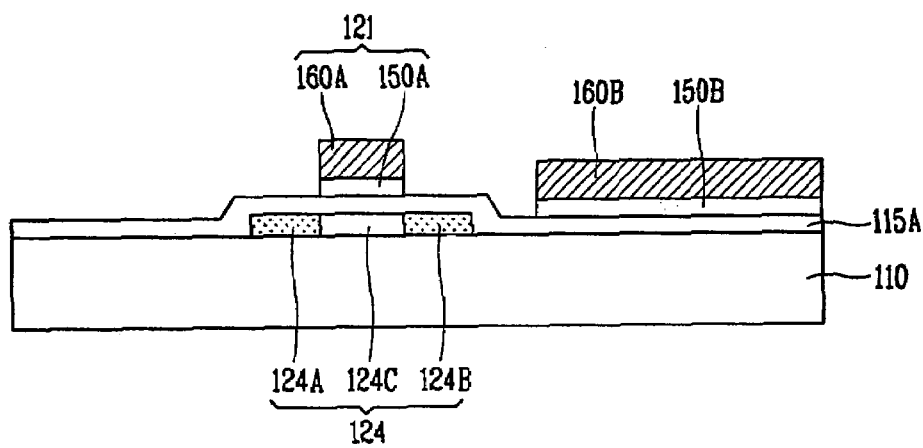

Next, as illustrated in FIG. 5B (or FIG. 4B), the second conductive film 160 and the first conductive film 150 are selectively patterned by using the photolithography process (a second masking process) in order to form the gate electrode 121, the gate line 116 and the pixel electrode 150B.

The gate electrode 121 includes a first gate electrode pattern 150A formed as a transparent first conductive film and a second gate electrode pattern 160A formed as an opaque second conductive film, and a pixel electrode pattern 160B formed as an opaque second conductive film with the same form as the pixel electrode 150B remains on the pixel electrode 150B formed of the transparent first conductive film.

Thereafter, an impurity ion (namely, dopant) is injected into certain regions of the active pattern 124 by using the gate electrode 121 as a mask to form a source region 124A and a drain region 124B, namely, ohmic contract layers. In this case, the gate electrode 121 serves as an ion stopper preventing infiltration of the dopant into the channel region 124C of the active pattern 124.

Electrical characteristics of the active pattern 124 can change according to a type of the injected dopant, and if the injected dopant corresponds to a 3-group element such as boron (B), it operates as a P-type TFT, while if the injected dopant corresponds to a 5-group element such as phosphor (P), it operates as an N-type TFT.

After the ion-injection process, a process for activating the injected dopant can be performed.

Figure 5C:
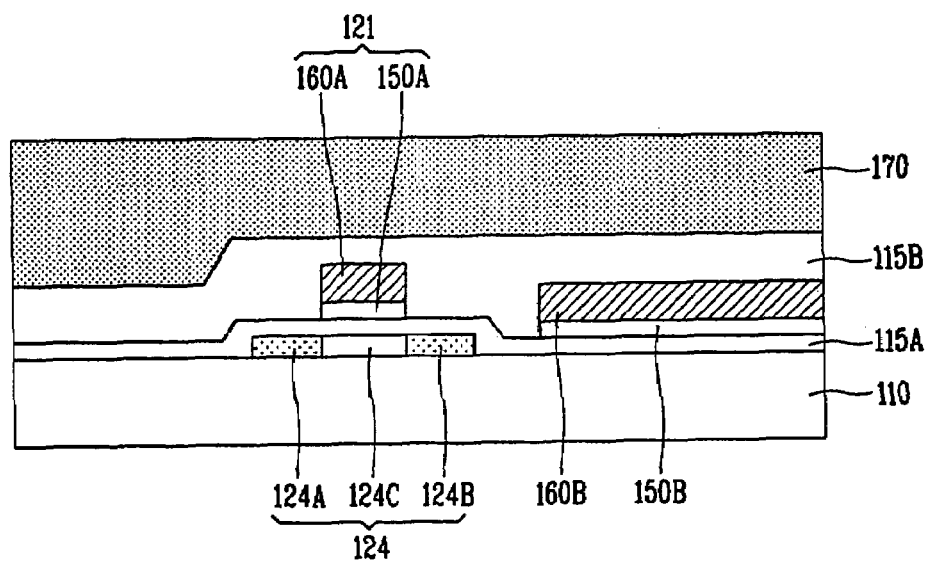

Thereafter, as illustrated in FIG. 5C, a second insulation film 115B is deposited on the entire surface of the substrate 110 with the gate electrode 121, the gate line 116 and the pixel electrode 150B formed thereon, to form a photosensitive film 170 made of a photosensitive material such as photoresist.

The second insulation film 115B can be formed of a transparent organic insulation material such as benzocyclobutene (BCB) or an acrylic resin for a high aperture ratio.

Figure 5D:
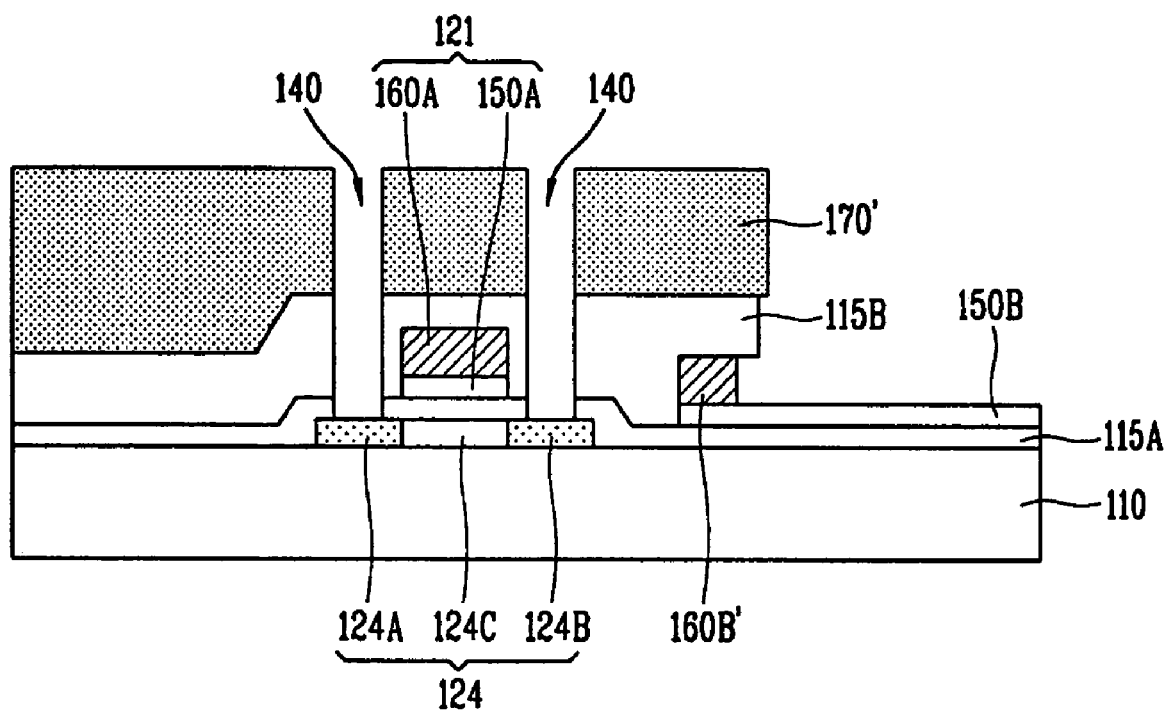

And then, as illustrated in FIG. 5D, light is irradiated on the photosensitive film through the photolithography process (a third masking process) and then the exposed photosensitive film 170 is developed to form a photosensitive film pattern 170' for forming the contact hole and opening the pixel electrode region.

Subsequently, a portion of the second insulation film 115B and the first insulation film 115A is removed by using the photosensitive film pattern 170' as a mask to form a pair of contact holes 140 exposing a portion of the source/drain regions 124A and 124B of the active pattern 124, and simultaneously, the second insulation film 115B and the pixel electrode pattern 160B formed as the second conductive film at the pixel electrode region are removed to expose the surface of the pixel electrode 150B formed as the first conductive film formed of the transparent conductive material.

Because of the alignment margin between photolithography equipment and the mask, the pixel electrode region is opened with a certain distance inward from the pixel electrode 150B, leaving the second conductive film pattern 160B' formed as the second conductive film at an upper portion of the edge of the pixel electrode 150B.

The pixel electrode pattern 160B remaining at the upper portion of the pixel electrode 150B is not removed using a mask but removed using the pattern of the second insulation film 115B (or the photosensitive film pattern 170')) so that the pixel electrode region can be simultaneously opened when the contact hole 140 is formed, and in this case, the second conductive film, namely, the pixel electrode pattern 160B is excessively etched to generate an undercut at the boundary between the second insulation film 115B at the upper portion of the edge of the pixel electrode 150B and the second conductive film pattern 160B'.

Thereafter, as illustrated in FIG. 4C, the photosensitive film pattern 170' is removed and then the photolithography process is performed twice to form the gate electrode 121, the gate line 116 and the pixel electrode 150B.

Figure 4D:
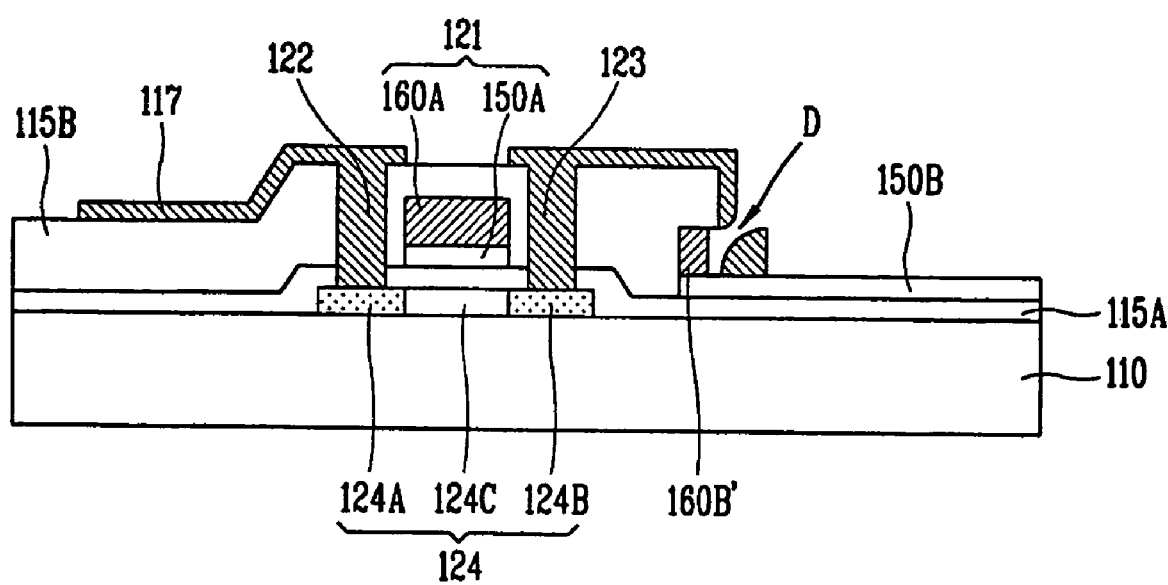

And then, as illustrated in FIG. 4D, a third conductive film is deposited on the entire surface of the substrate 110 and then patterned by using the photolithography process (a fourth masking process) to form the source electrode 122 connected with the source region 124A and the drain electrode 123 connected with the drain region 124B through the contact hole 140.

A portion of the source electrode 122 extends in one direction to form the data line 117 and a portion of the drain electrode 123 extends toward the pixel electrode so as to be connected with the pixel electrode 150B.

In the process of fabricating the array substrate in accordance with the first embodiment of the present invention, the gate electrode, the gate line and the pixel electrode are simultaneously patterned and one process for forming contact hole is reduced, so that two times of masking processes are reduced compared with a general fabrication process. Accordingly, the yield can be increased thanks to the simplification of the fabrication process and the fabrication cost can be reduced.

However, as illustrated, due to the undercut at the second conductive film pattern 160B' formed at the upper portion of the edge of the pixel electrode 150B, the drain electrode 123 and the pixel electrode 150B may not connected.

Thus, the second conductive film is etched to open the pixel electrode region in the following process of forming the source/drain electrodes in order to prevent the deficiency of disconnection between the drain electrode and the pixel electrode due to the undercut of the second conductive film pattern. This will be described in detail in the second embodiment of the present invention as follows.

FIGS. 6A to 6D are sequential sectional views illustrating a process of fabricating an array substrate in accordance with a second embodiment of the present invention, and FIGS. 7A to 7D are sequential plan views illustrating the process of fabricating the array substrate in accordance with the second embodiment of the present invention.

The process for fabricating the LCD device in the second embodiment is the same as that of the first embodiment, except that a process order is changed to prevent a disconnection between the drain electrode and the pixel electrode caused by an undercutting of the second conductive film pattern that is generated when the second insulation film and the second conductive film of the pixel electrode region are etched.

Figure 6A:
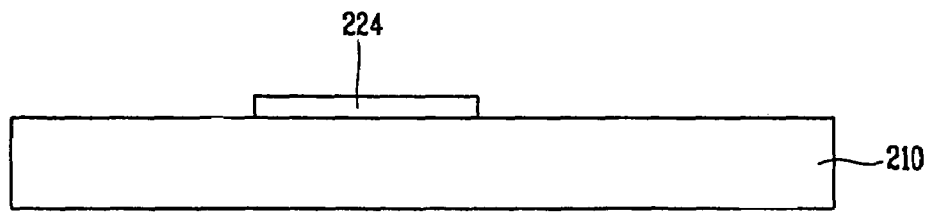
FIGS. 6A to 6D are sequential sectional views illustrating a process of fabricating an array substrate in accordance with a second embodiment of the present invention.
Figure 7A:
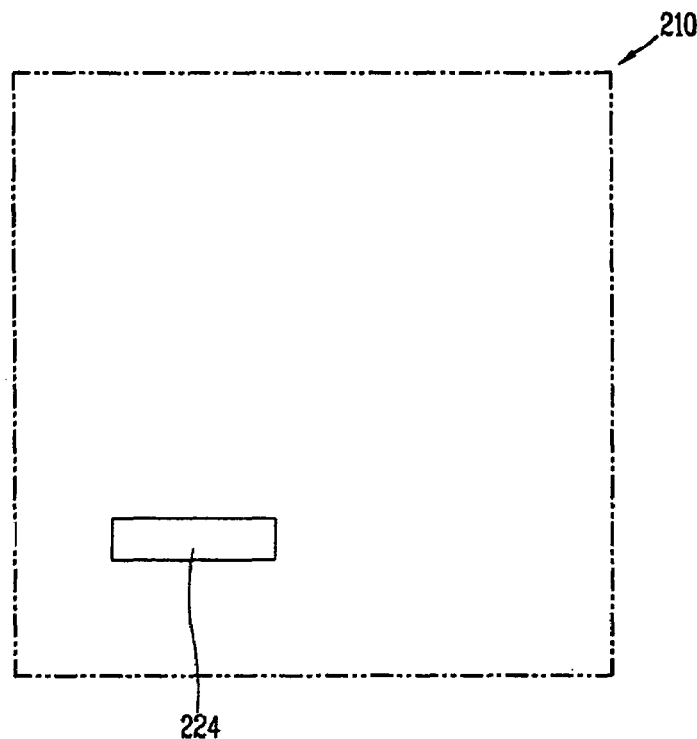
FIGS. 7A to 7D are sequential plan views illustrating the process of fabricating the array substrate in accordance with the second embodiment of the present invention.

With reference to FIGS. 6A and 7A, an active pattern 224 is formed as a silicon layer on a substrate 210 made of a transparent insulation material such as glass by using the photolithography process (a first masking process).

Figure 6B:
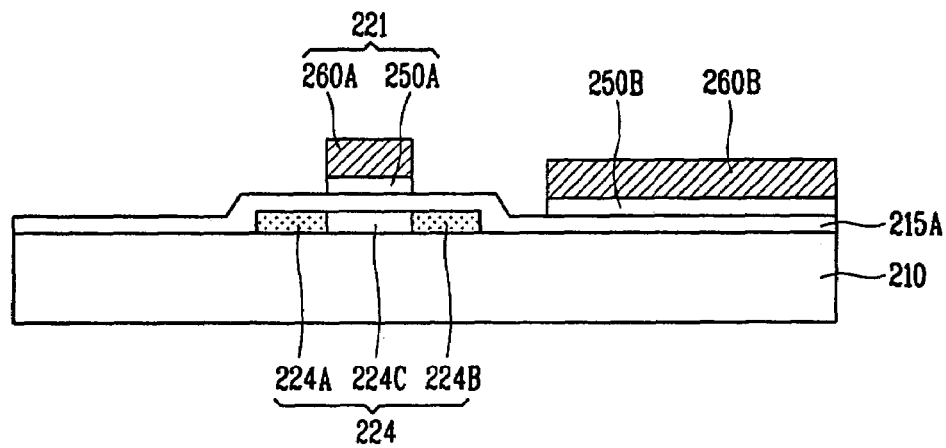
Figure 7B:
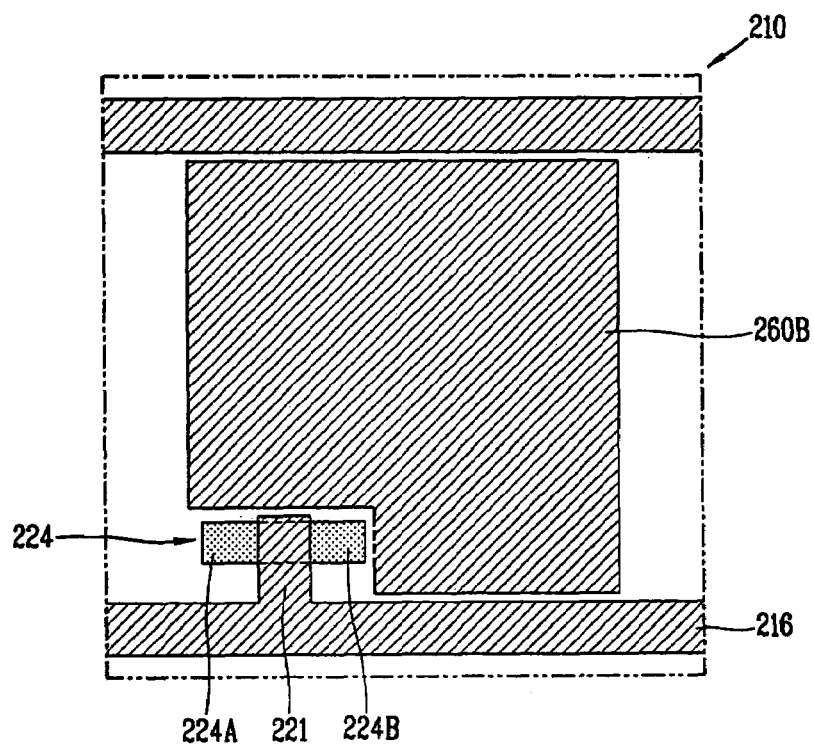

Next, as illustrated in FIGS. 6B and 7B, a first insulation film 215A, a first conductive film and a second conductive film are sequentially formed on the entire surface of the substrate 210.

And then, the second and the first conductive films are selectively patterned by using the photolithography (a second making process) to simultaneously form a gate electrode 221, a gate line 216 and a pixel electrode 250B.

The gate electrode 221 includes a first gate electrode pattern 250A formed as the transparent first conductive film and a second gate electrode pattern 260A formed as the opaque second conductive film, and a pixel electrode pattern 260B formed as an opaque second conductive film with the same form as the pixel electrode 250B remains on the pixel electrode 250B made of the transparent first conductive film.

Thereafter, an impurity ion (namely, dopant) is injected into a certain region of the active pattern 224 by using the gate electrode 221 as a mask to form a source region 224A and a drain region 224B, namely, ohmic contract layers.

In order to prevent disconnection between the drain electrode and the pixel electrode due to the undercut of the second conductive film pattern in the first embodiment, in the second embodiment, the second conductive film for opening the pixel electrode region is etched in the following process of forming the source/drain electrodes. This will be described in detail through the follow-up process of FIGS. 6C and 6D.

Figure 6C:
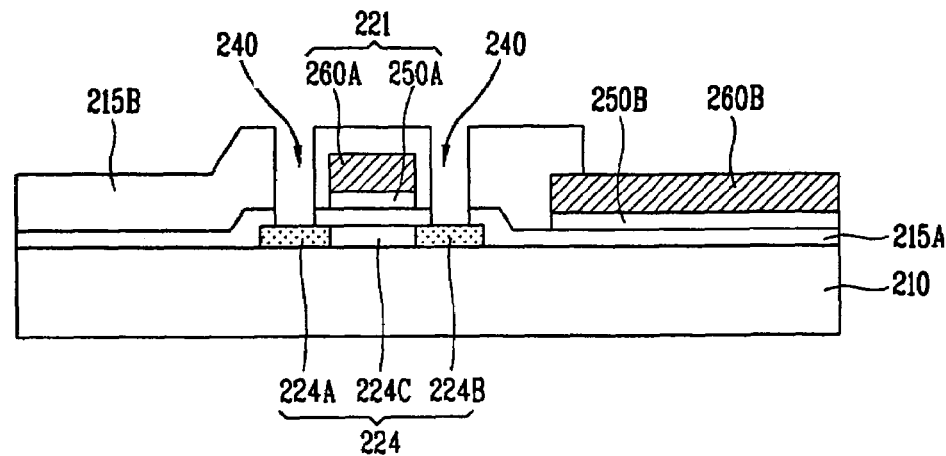
Figure 7C:
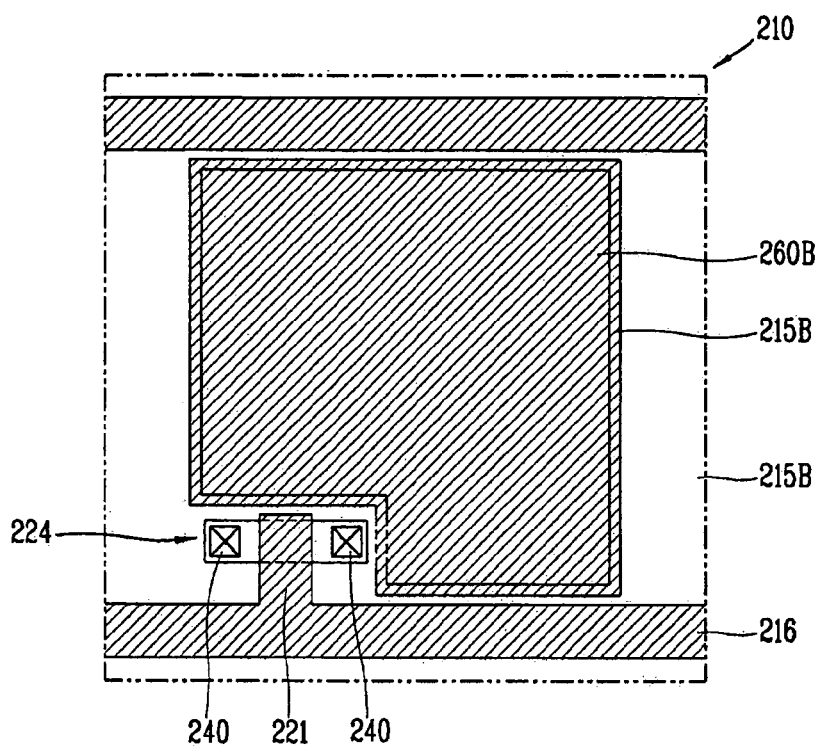

As illustrated in FIGS. 6C and 7C, a second insulation film 215B is deposited on the entire surface of the substrate 210 with the gate electrode 221, the gate line and the pixel electrode 250B formed thereon, and then patterned through the photolithography process (a third masking process) to form the contact hole 240 at the source/drain regions 224A and 224B and at the same time open the pixel electrode region. In this embodiment, only the second insulation film 215B of the pixel electrode region is removed to leave the pixel electrode pattern 260B made of the second conductive film at the upper portion of the pixel electrode 250B.

The third masking process will be described in detail through FIGS. 8A to 8D as follows.

Figure 8A:
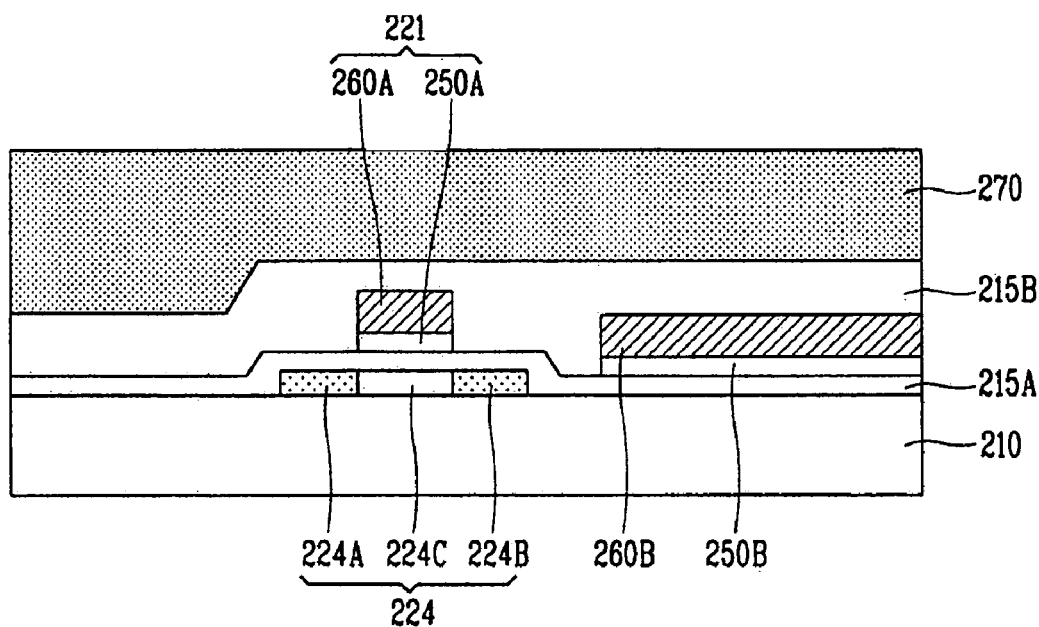
FIGS. 8A to 8D are sectional view illustrating a process of forming a gate electrode, a gate line and a pixel electrode in FIGS. 6B to 6D in accordance with the second embodiment of the present invention.

First, as illustrated in FIG. 8A, a first photosensitive film 270 made of a photosensitive material such as photoresist is formed on the entire surface of the substrate 210 with the second insulation film 215B formed thereon.

Figure 8B:
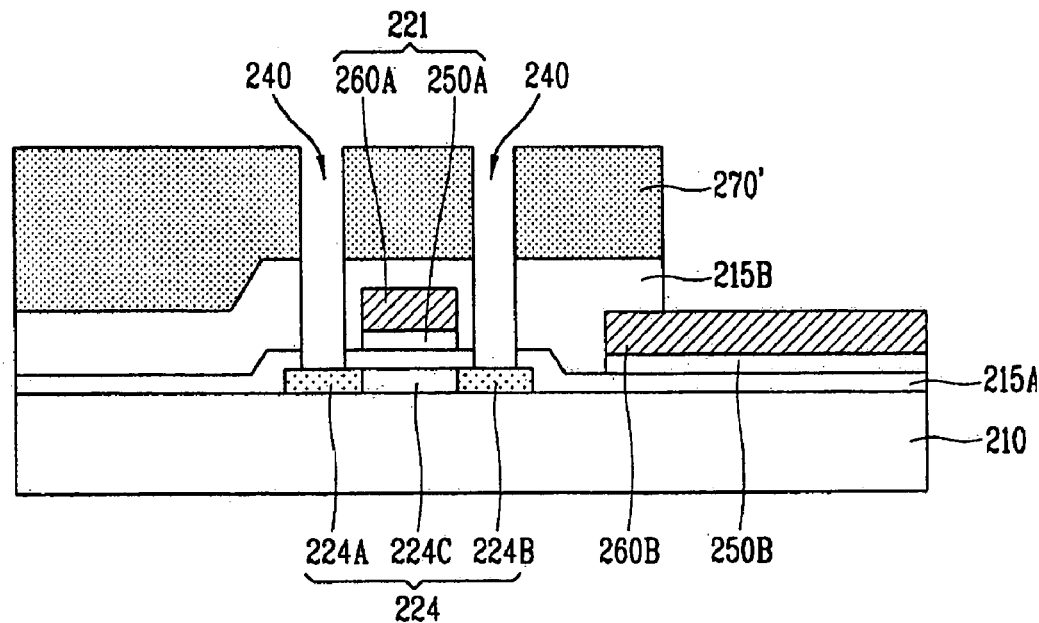

Thereafter, as illustrated in FIG. 8B, light is irradiated on the first photosensitive film 270 through the photolithography process and then the exposed first photosensitive film 270 is developed to form a first photosensitive film pattern 270' for forming the contact hole and opening the pixel electrode region.

Subsequently, a portion of the second insulation film 215B and the first insulation film 215A is removed by using the first photosensitive film pattern 270' as a mask to form a pair of contact holes 240 exposing a portion of the source/drain regions 224A and 224B of the active pattern 224, and simultaneously, the second insulation film 215B of the pixel electrode region is removed to expose the surface of the pixel electrode pattern 260B formed as the second conductive film.

Figure 8C:
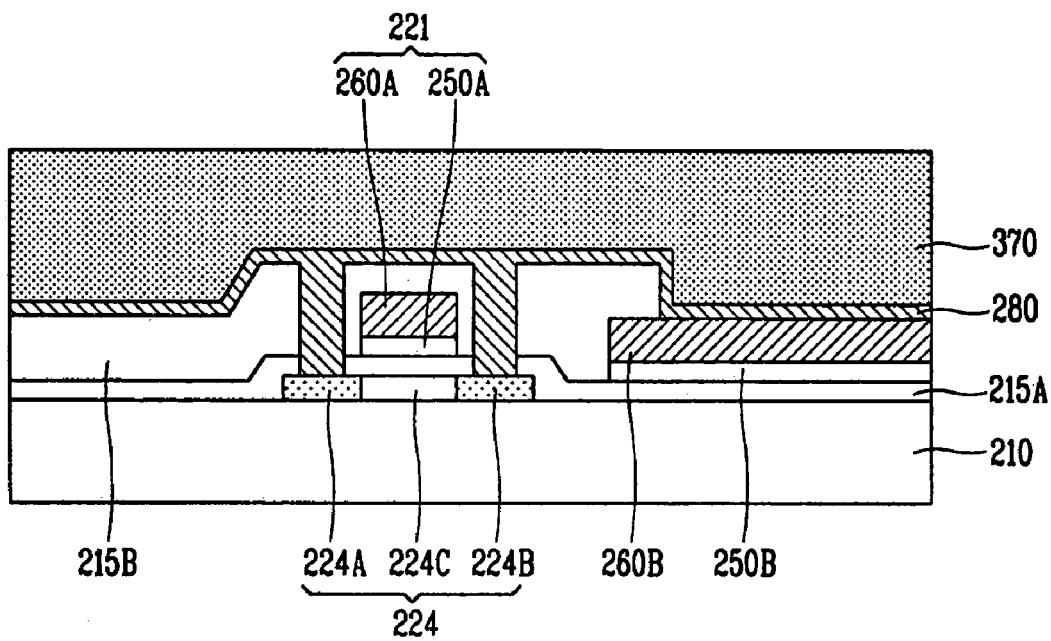
Figure 8D:
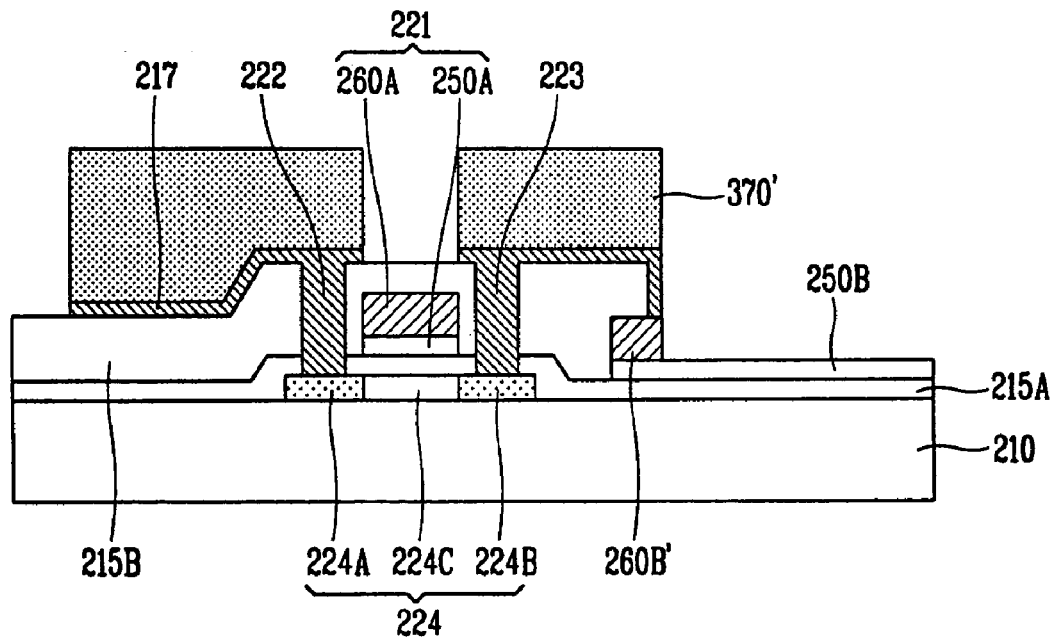

Thereafter, as illustrated in FIG. 8C, a third conductive film 280 is deposited on the entire surface of the substrate 210, and then, a second photosensitive film 370 for patterning the source/drain electrodes is formed.

At this time, since a third conductive film 280 is directly deposited at the upper portion of the pixel electrode pattern 250B of the pixel electrode region so as to be electrically connected with the pixel electrode pattern 250B, although the a portion of the pixel electrode pattern 250B and the third conductive film 280 is removed through an etching process (to be described), such a deficiency of disconnection between the drain electrode and the pixel electrode as in the first embodiment cannot be generated.

Light is selectively irradiated on the second photosensitive film 370 through the photolithography process (a fourth masking process), and then, the exposed second photosensitive film 370 is developed to form a second photosensitive film pattern 370' for defining the source/drain electrode regions and removing the pixel electrode pattern 260B of the pixel electrode region.

A portion of the third conductive film 280 is removed by using the second photosensitive film pattern 370' as a mask to simultaneously form a source electrode 222 connected with the source region 224A and a drain electrode 223 connected with the drain region 224B through the contact hole 240, and at the same time, the pixel electrode pattern 260B of the pixel electrode region is removed to expose the surface of the pixel electrode 250B formed as the transparent first conductive film.

In this case, in order to simultaneously etch the third conductive film constituting the source/drain electrodes 222 and 223 and the second conductive film constituting the pixel electrode pattern 260B through one time of etching process, the second and third conductive films can be formed of the same conductive metal material.

For the same reason as in the first embodiment of the present invention, the pixel electrode pattern 260B of the pixel electrode region remains at the upper portion of the edge of the pixel electrode 250B, without being etched, to form a second conductive film pattern 260B'.

When the pixel electrode pattern 260B formed as the second conductive film remaining at the upper portion of the pixel electrode 250B is removed at the same time when the source/drain electrodes 222 and 223 are formed, although undercut is generated at the boundary of the second conductive film pattern 260B' due to an excessive etching of the second conductive film, such a deficiency of disconnection between the drain electrode 223 and the pixel electrode as in the first embodiment of the present invention cannot be generated because the drain electrode 223 and the second conductive film pattern 260B' are connected.

Figure 6D:
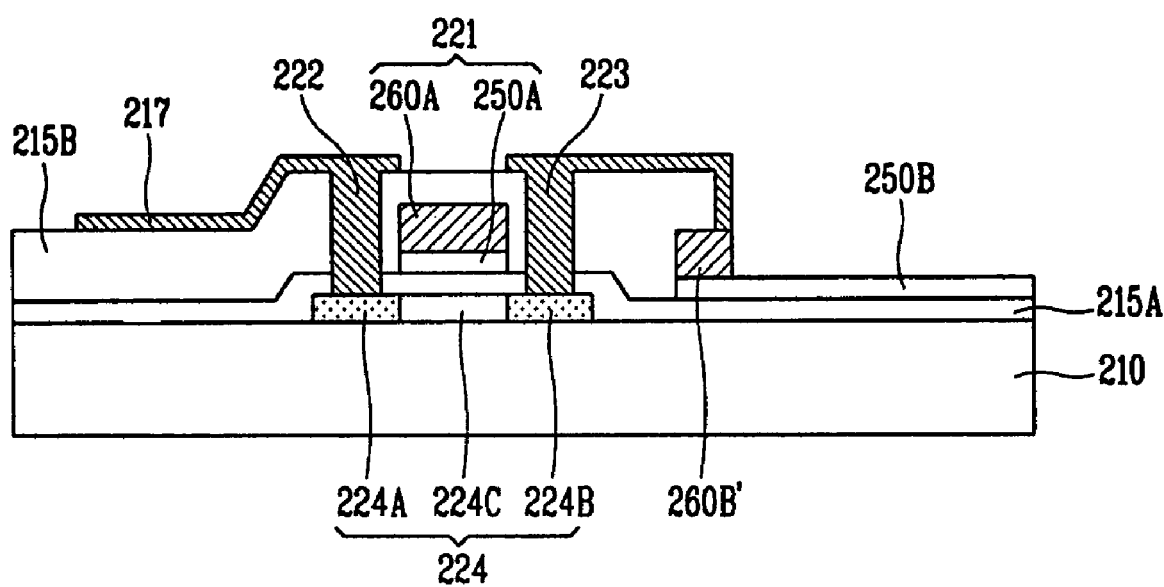
Figure 7D:
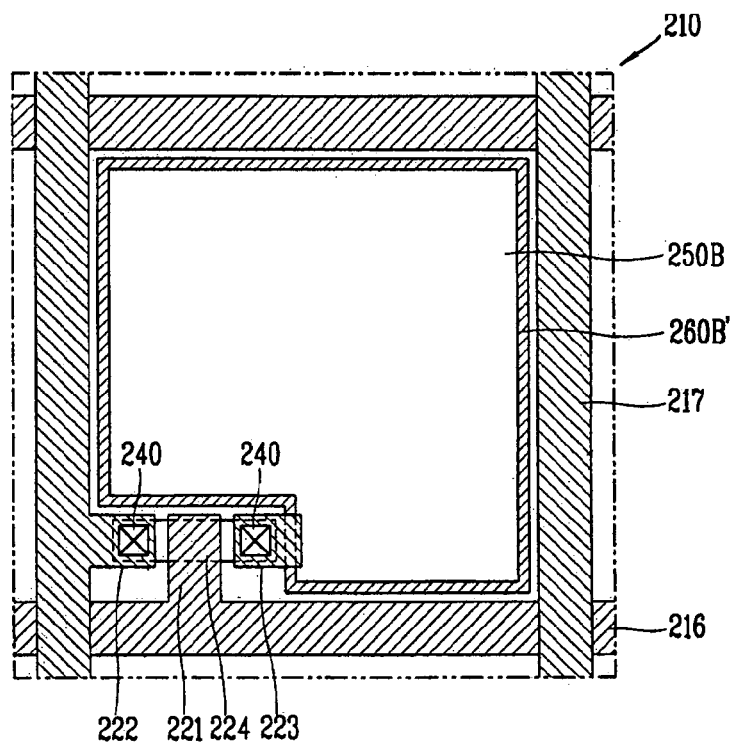

Thereafter, as illustrated in FIGS. 6D and 7D, when the second photosensitive film pattern 370' is removed, the gate electrode 221, the source/drain electrodes 222 and 223 and the pixel electrode 250B are formed.

At this time, a portion of the source electrode 222 extends in one direction to form a data line 217, and a portion of the drain electrode 223 extends toward the pixel region so as to be connected with the pixel electrode 250B.

As so far described, the LCD device and its fabrication method in accordance with the present invention have many advantages.

That is, for example, because the gate electrode and the pixel electrode are simultaneously patterned, the number of masks used for fabrication of the TFT can be reduced, and thus, the fabrication process and cost can be reduced.

In addition, in fabricating the array substrate with the four-masking structure, the deficiency of disconnection between the drain electrode and the pixel electrode generated when the pixel electrode region is opened is solved, so the yield can be enhanced.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A method for fabricating a liquid crystal display device, comprising:
    providing first and second substrates;
    forming an active layer having a source region, a drain region and a channel region on the first substrate;
    forming a first insulation layer on the first substrate;
    forming first and second conductive layers on the first substrate;
    forming a gate electrode, a gate line and a pixel electrode on the first substrate by patterning the first and second conductive layers;
    forming a second insulation layer on the first substrate;
    forming a contact hole exposing a portion of the source and drain regions by removing a portion of the first and second insulation layers and removing the second insulation layer of the upper portion of the pixel electrode except for a portion in a periphery of the pixel electrode;
    forming a third conductive layer on the first substrate, wherein the third conductive layer directly contacts with the second conductive layer in which both cover the entire upper portion of the pixel electrode;
    forming source and drain electrodes electrically connected to the source and drain regions through the contact hole by patterning the third conductive layer;
    opening the pixel electrode by removing the second and third conductive layers of the upper portion of the pixel electrode except for a portion in the periphery of the pixel electrode, wherein the drain electrode directly connected to the pixel electrode without any other contact hole; and
    forming a liquid crystal layer between the first and second substrates.

2. The method of claim 1, wherein the active layer is formed as a silicon layer.

3. The method of claim 2, wherein the silicon layer is formed as a crystallized silicon film.

4. The method of claim 1, wherein the gate electrode and the gate line is formed of a dual layer of the first and second conductive layers by patterning the first and second conductive layers.

5. The method of claim 1, wherein the pixel electrode is formed of the first conductive layer by patterning the first and second conductive layers.

6. The method of claim 5, wherein the upper portion of the pixel electrode remains a pixel electrode pattern of the second conductive layer.

7. The method of claim 6, wherein removing the second insulation layer on the pixel electrode exposes the pixel electrode pattern.

8. The method of claim 1, wherein the first or the second conductive layer is formed of one of indium tin oxide (ITO) and indium zinc oxide (IZO).

9. The method of claim 1, wherein the second conductive layer is formed of one of aluminum, an aluminum alloy, tungsten, copper, chromium and molybdenum.

10. The method of claim 1, further comprising:
patterning the second conductive layer on the pixel electrode to remain a second conductive layer pattern electrically connected to the drain electrode in a periphery of the upper portion of the pixel electrode.

11. The method of claim 10, wherein the third and the second conductive layers on the pixel electrode are patterned when a portion of the drain electrode and the second conductive layer pattern on the pixel electrode are electrically connected.

12. The method of claim 1, wherein a mask for forming the contact hole includes a pixel electrode pattern for opening the pixel electrode region.

13. The method of claim 12, wherein removing the second insulation layer on the pixel electrode using the mask exposes the second conductive layer on the pixel electrode.

14. The method of claim 1, further comprising forming source and drain regions by injecting an impurity ion to a region of the active layer using the gate electrode as a mask after forming the gate electrode.

15. The method of claim 1, wherein forming the contact hole and removing the second insulation layer on the pixel electrode are substantially simultaneously preceded.

16. The method of claim 1, wherein forming the source and drain electrodes opening the pixel electrode are substantially simultaneously preceded.

17. A method for fabricating a liquid crystal display device, comprising:
providing first and second substrates;
forming an active layer on the first substrate;
forming a first insulation layer on the first substrate;
forming a gate electrode, a gate line and a pixel electrode formed of a dual layer having first and second conductive layers on the first substrate;
forming a second insulation layer exposing a portion of the active layer and the pixel electrode;
forming source and drain electrodes electrically connected to the portion of the active layer through a contact hole by patterning a third conductive layer over the entire pixel electrode and opening the pixel electrode by removing the second and third conductive layers of an upper portion of the pixel electrode except for a portion in a periphery of the pixel electrode, wherein the drain electrode directly connected to the pixel electrode without any other contact hole of the first conductive layer; and
forming a liquid crystal layer between the first and second substrates.

18. The method of claim 17, wherein the pixel electrode is formed of the first conductive layer by patterning the first and second conductive layers.

19. The method of claim 18, wherein an upper portion of the pixel electrode remains a pixel electrode pattern of the second conductive layer.

20. The method of claim 17, wherein forming the second insulation layer includes:
forming the second insulation layer on the first substrate; and
forming the contact hole exposing a portion of the source and drain regions of the active layer by removing a portion of the first and second insulation layers and exposing the pixel electrode by removing the second insulation layer on the pixel electrode except for the portion of the periphery of the pixel electrode.

21. The method of claim 20, wherein forming the contact hole and removing the second insulation layer on the pixel electrode are substantially simultaneously preceded.

22. The method of claim 17, wherein the first conductive layer of the pixel electrode is exposed by patterning the second conductive layer on the pixel electrode so as to remain the second conductive layer pattern electrically connected to the drain electrode at an edge of the upper portion of the pixel electrode.

* * * * *